(12) United States Patent
Ishida et al.

(10) Patent No.: US 10,461,270 B2
(45) Date of Patent: Oct. 29, 2019

(54) ORGANIC EL DISPLAY DEVICE

(71) Applicant: Sharp Kabushiki Kaisha, Sakai, Osaka (JP)

(72) Inventors: Mamoru Ishida, Sakai (JP); Yoshifumi Ohta, Sakai (JP); Takeshi Hirase, Sakai (JP); Takashi Ochi, Sakai (JP); Tohru Senoo, Sakai (JP); Tohru Sonoda, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/085,606

(22) PCT Filed: Mar. 22, 2017

(86) PCT No.: PCT/JP2017/011503
§ 371 (c)(1),
(2) Date: Sep. 17, 2018

(87) PCT Pub. No.: WO2017/170056
PCT Pub. Date: Oct. 5, 2017

(65) Prior Publication Data
US 2019/0088895 A1 Mar. 21, 2019

(30) Foreign Application Priority Data
Mar. 29, 2016 (JP) ................. 2016-066191

(51) Int. Cl.
*H01L 51/50* (2006.01)
*G06F 3/041* (2006.01)
(Continued)

(52) U.S. Cl.
CPC ............ *H01L 51/504* (2013.01); *G06F 3/041* (2013.01); *G06F 3/0488* (2013.01);
(Continued)

(58) Field of Classification Search
CPC .............. H01L 51/504; H01L 27/3244; H01L 51/0097; H01L 51/5262; H01L 51/56; H01L 51/5253; G06F 3/0488; G06F 3/041
See application file for complete search history.

(56) References Cited

U.S. PATENT DOCUMENTS

2014/0308580 A1   10/2014  Yamada
2015/0044442 A1   2/2015   Huang et al.
(Continued)

FOREIGN PATENT DOCUMENTS

JP   2003-168556 A   6/2003
JP   2004-001296 A   1/2004
(Continued)

OTHER PUBLICATIONS

Translation of Foreign Patent JP 2015-037075 (Year: 2015).*
Official Communication issued in International Patent Application No. PCT/JP2017/011503, dated Jun. 20, 2017.

*Primary Examiner* — Yasser A Abdelaziez
(74) *Attorney, Agent, or Firm* — Keating & Bennett, LLP (57) ABSTRACT

An organic EL display device includes an organic EL display panel having a plastic substrate exhibiting flexibility and organic EL elements formed on the plastic substrate, a first inorganic layer provided on an upper surface of the organic EL display panel, and a second inorganic layer provided on a lower surface of the organic EL display panel. The entire thickness T of the organic EL display device is equal to or less than 74 μm.

20 Claims, 5 Drawing Sheets

(51) Int. Cl.

| | |
|---|---|
| *G06F 3/0488* | (2013.01) |
| *H01L 27/32* | (2006.01) |
| *H01L 51/00* | (2006.01) |
| *H01L 51/52* | (2006.01) |
| *H01L 51/56* | (2006.01) |

(52) U.S. Cl.
CPC ...... *H01L 27/3244* (2013.01); *H01L 51/0097* (2013.01); *H01L 51/5253* (2013.01); *H01L 51/5262* (2013.01); *H01L 51/56* (2013.01); *G06F 2203/04102* (2013.01); *G06F 2203/04103* (2013.01)

(56) References Cited

U.S. PATENT DOCUMENTS

| | | | |
|---|---|---|---|
| 2015/0153862 A1* | 6/2015 | Nakamura | G06F 3/041 345/173 |
| 2016/0035801 A1* | 2/2016 | Kim | H01L 27/3244 257/40 |
| 2016/0164030 A1 | 6/2016 | Yasuda | |
| 2017/0338442 A1* | 11/2017 | Ishida | G09F 9/30 |

FOREIGN PATENT DOCUMENTS

| | | |
|---|---|---|
| JP | 2009-081122 A | 4/2009 |
| JP | 2013-132897 A | 7/2013 |
| JP | 2015-037075 A | 2/2015 |
| JP | 2016-001457 A | 1/2016 |
| WO | 2015/008642 A1 | 1/2015 |

\* cited by examiner

ORGANIC EL DISPLAY DEVICE

TECHNICAL FIELD

The present invention relates to an organic EL display device including organic electroluminescence elements (hereinafter referred to as "organic EL elements").

BACKGROUND ART

In recent years, a liquid crystal display device has been often used as a flat panel display in various fields. However, there are still major issues such as a significant change in contrast or color tone due to a viewing angle, difficulty in power consumption reduction due to the necessity of a light source such as a backlight, and limitations on thickness reduction and weight reduction. Moreover, the liquid crystal display device still has another major issue regarding flexibility enhancement.

For these reasons, a light-emitting organic EL display device using organic EL elements has been recently expected as a display device as a substitute for the liquid crystal display device. Each of the organic EL elements is configured such that organic molecules forming an organic EL layer sandwiched between an anode and a cathode emit light by application of current to the organic EL layer. The organic EL display device using the organic EL elements is of the light-emitting type, and therefore, is excellent in terms of thickness reduction, weight reduction, and power consumption reduction. Moreover, due to a wide viewing angle, the organic EL display device has drawn great attention as a flat panel more advantageous than a liquid crystal panel.

Moreover, among the organic EL display devices, an organic EL display device using plastic substrates having more advantages than a glass substrate in terms of flexibility, impact resistance, and weight reduction has drawn much attention, and has such a potential that a new organic EL display device impossible in a display including a glass substrate is created.

Typically, when the organic EL element is driven for a certain period, light emission properties such as light emission brightness and light emission uniformity are significantly lowered as compared to an initial state. Reasons for lowering of the light emission properties include, for example, deterioration of an organic layer due to moisture from external air entering the organic EL element, and detachment of the organic layer and an electrode due to moisture.

For these reasons, the technique of providing an inorganic layer (a sealing layer) for preventing entrance of gas such as moisture has been disclosed. More specifically, e.g., an organic EL element sealed with a gas barrier film having a gas barrier layer on a film surface is disclosed (see, e.g., Patent Document 1).

CITATION LIST

Patent Document

PATENT DOCUMENT 1: Japanese Unexamined Patent Publication No. 2009-81122

SUMMARY OF THE INVENTION

Technical Problem

However, in the configuration described in Patent Document 1, there is a problem that when the organic EL display device is bent, the inorganic layer provided on a surface of an organic EL display panel is ruptured due to stress upon bending. As a result, in the organic EL display device, barrier performance against moisture is lowered.

For these reasons, the present invention has been made in view of the above-described problems, and is intended to provide an organic EL display device capable of preventing rupturing of an inorganic layer and preventing deterioration of an organic EL element even in a case where the organic EL display device is bent.

Solution to the Problem

For accomplishing the above-described object, the organic EL display device of the present invention includes an organic EL display panel including a plastic substrate exhibiting flexibility and an organic EL element formed on the plastic substrate, a first inorganic layer provided on an upper surface of the organic EL display panel, and a second inorganic layer provided on a lower surface of the organic EL display panel as a surface of the plastic substrate opposite to a first inorganic layer side. The entire thickness of the organic EL display device is equal to or less than 74 µm.

Advantages of the Invention

According to the present invention, rupturing of the inorganic layer upon bending of the organic EL display device can be prevented, and deterioration of the organic EL element can be prevented.

DESCRIPTION OF EMBODIMENTS

Hereinafter, embodiments of the present invention will be described in detail with reference to the drawings. Note that the present invention is not limited to the embodiments below.

First Embodiment

Figure 1:
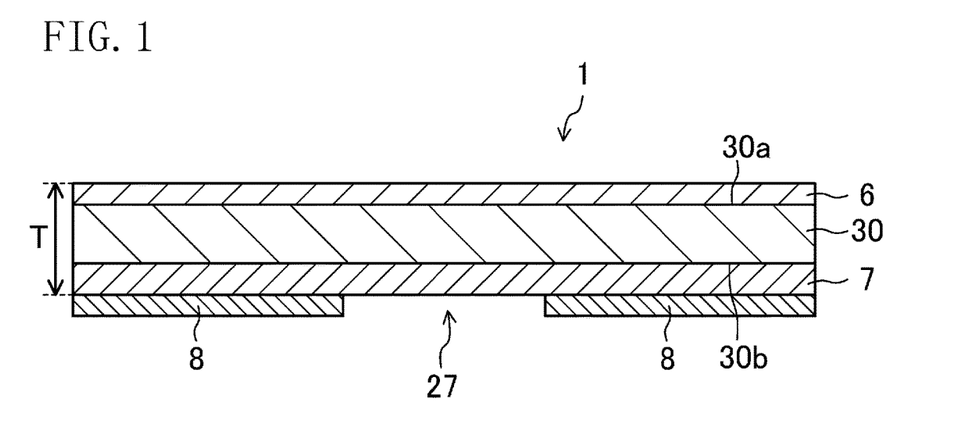
FIG. 1 is a sectional view of an organic EL display device according to a first embodiment of the present invention.
Figure 2:
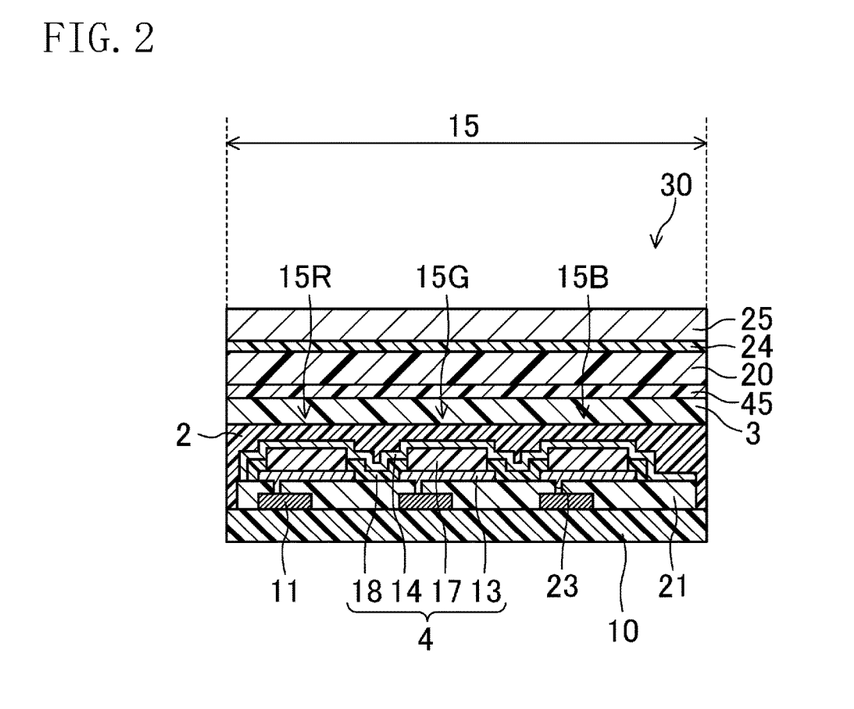
FIG. 2 is a sectional view of an organic EL display panel according to the first embodiment of the present invention.
Figure 3:
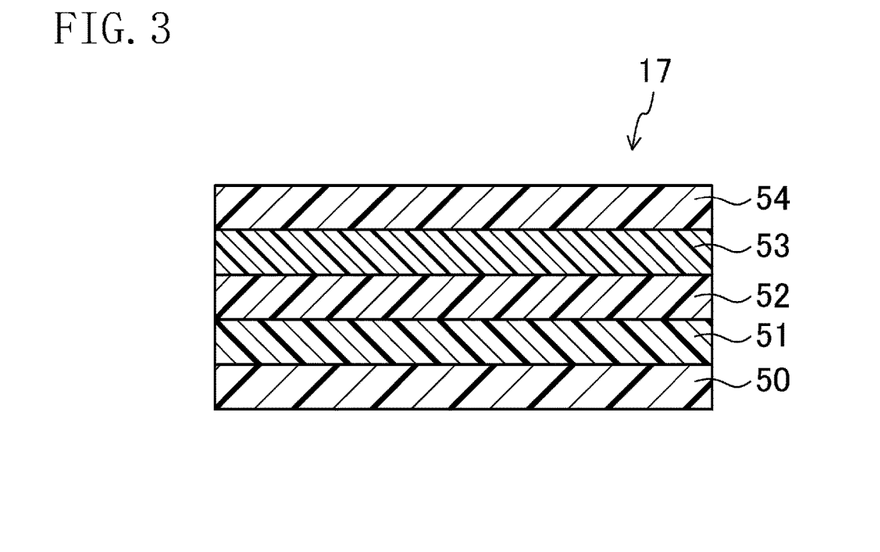
FIG. 3 is a sectional view for describing an organic EL layer forming organic EL elements included in the organic EL display device according to the first embodiment of the present invention.

FIG. 1 is a sectional view of an organic EL display device according to a first embodiment of the present invention, and FIG. 2 is a sectional view of the organic EL display device according to the first embodiment of the present invention. Moreover, FIG. 3 is a sectional view for describing an organic EL layer forming an organic EL element included in the organic EL display device according to the first embodiment of the present invention.

As illustrated in FIG. 1, an organic EL display device 1 includes an inorganic layer 6 provided on an upper surface 30a of an organic EL display panel 30, and an inorganic layer 7 provided on a lower surface 30b of the organic EL display panel 30. Note that a housing 8 is attached to a surface of the inorganic layer 7 in the organic EL display device 1.

As illustrated in FIG. 2, the organic EL display panel 30 includes a plastic substrate 10 as an element substrate, and organic EL elements 4 formed on the plastic substrate 10. Note that the above-described inorganic layer 7 is provided on the surface of the plastic substrate 10 opposite to the inorganic layer 6.

The plastic substrate 10 is a film-shaped substrate exhibiting flexibility and made of a resin material exhibiting insulating properties, and an organic material such as polyimide resin or acrylic resin can be used as the resin material forming the plastic substrate 10.

Moreover, as illustrated in FIG. 2, the organic EL display panel 30 has a display region 15 where the organic EL elements 4 are arrayed. In the display region 15, the organic EL elements 4 are formed and arranged in a matrix on a plastic-substrate-10-side surface. Moreover, in the display region 15, a display region 15R configured to emit red light, a display region 15G configured to emit green light, and a display region 15B configured to emit blue light are arrayed according to a predetermined pattern.

As illustrated in FIG. 2, the organic EL elements 4 include multiple first electrodes 13 (anodes) arranged in a predetermined array (e.g., in a matrix) on the plastic substrate 10, an organic EL layer 17 formed on each of the multiple first electrodes 13, and a second electrode 14 formed on the organic EL layer 17.

Moreover, an edge cover 18 provided to cover a peripheral edge portion of each first electrode 13 and a region where no first electrodes 13 are provided is included in the organic EL elements 4. The edge cover 18 is provided between adjacent ones of the pixel regions 15R, 15G, 15B, and functions as a partition wall configured to divide the pixel regions 15R, 15G, 15B.

Further, as illustrated in FIG. 2, the organic EL display panel 30 includes TFTs 11 provided on the plastic substrate 10 and each electrically connected to the multiple first electrodes 13 arranged in the predetermined array, and an interlayer insulating film 21 formed on the plastic substrate 10 and covering the TFTs 11.

Each first electrode 13 has the function of injecting holes (electron holes) to the organic EL layer 17. The first electrode 13 is more preferably made of a material with a great work function. This is because formation of the first electrode 13 from the material with a great work function can improve the efficiency for injecting electron holes to the organic EL layer 17. Moreover, as illustrated in FIG. 2, the first electrodes 13 are formed on the interlayer insulating film 21.

The material forming the first electrode 13 includes, for example, metal materials such as silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). Further, the material may include, for example, alloys such as magnesium (Mg)/copper (Cu), magnesium (Mg)/silver (Ag), sodium (Na)/potassium (K), astatine (At)/astatine oxide ($AtO_2$), lithium (Li)/aluminum (Al), lithium (Li)/calcium (Ca)/aluminum (Al), and lithium fluoride (LiF)/calcium (Ca)/aluminum (Al). In addition, the material may include, for example, conductive oxides such as tin oxide (SnO), zinc oxide (ZnO), indium tin oxide (ITO), and indium zinc oxide (IZO).

Moreover, the first electrode 13 may be, for example, formed from a stack of multiple layers made of the above-described materials. The material with a great work function includes, for example, indium tin oxide (ITO) and indium zinc oxide (IZO).

The interlayer insulating film 21 is formed on the plastic substrate 10, and has the function of flattening a surface of a film at which the TFTs 11 are formed. By the interlayer insulating film 21, e.g., the first electrodes 13 and the organic EL layer 17 formed above the interlayer insulating film 21 can be formed flat. That is, the interlayer insulating film 21 is for reducing non-uniform light emission from the organic EL layer 17 due to influence of a lower layer side step or a recessed-raised portion of the organic EL display device 1 on the surface shape of each first electrode 13. The interlayer insulating film 21 is made of an inexpensive organic resin material exhibiting high transparency, such as acrylic resin.

Moreover, as illustrated in FIG. 2, each first electrode 13 is electrically connected to the TFT 11 through a contact hole 23 formed at the interlayer insulating film 21.

The organic EL layer 17 is formed on a surface of each first electrode 13 divided in a matrix. As illustrated in FIG. 3, the organic EL layer 17 includes an electron hole injection layer 50, an electron hole transport layer 51 formed on a surface of the electron hole injection layer 50, a light emission layer 52 formed on a surface of the electron hole transport layer 51 and configured to emit any of red light, green light, and blue light, an electron transport layer 53 formed on a surface of the light emission layer 52, and an electron injection layer 54 formed on a surface of the electron transport layer 53. The electron hole injection layer 50, the electron hole transport layer 51, the light emission layer 52, the electron transport layer 53, and the electron injection layer 54 are sequentially stacked on each other, thereby forming the organic EL layer 17. Note that the organic EL layer 17 may be formed to have a smaller area than that of the first electrode 13 provided below the organic EL layer 17, or may be formed to cover the first electrode 13 across a larger area.

The electron hole injection layer 50 is also called an anode buffer layer, and is used for bringing the energy levels of the first electrode 13 and the organic EL layer 17 close to each other to improve the efficiency for injecting electron holes from the first electrode 13 to the organic EL layer 17.

A material forming the electron hole injection layer 50 includes, for example, a triazole derivative, an oxadiazole derivative, an imidazole derivative, a polyarylalkane derivative, a pyrazoline derivative, a phenylenediamine derivative, an oxazole derivative, a styrylanthracene derivative, a fluorenone derivative, a hydrazone derivative, and a stilbene derivative.

The electron hole transport layer 51 has the function of improving the efficiency for transporting electron holes from the first electrode 13 to the organic EL layer 17. A material forming the electron hole transport layer 51 includes, for example, a porphyrin derivative, an aromatic tertiary amine compound, a styrylamine derivative, polyvinyl carbazole, poly-p-phenylenevinylene, polysilane, a triazole derivative, an oxadiazole derivative, an imidazole derivative, a polyarylalkane derivative, a pyrazoline derivative, a pyrazolone derivative, a phenylenediamine derivative, an arylamine derivative, an amine-substituted chalcone derivative, an oxazole derivative, a styrylanthracene derivative, a fluorenone derivative, a hydrazone derivative, a stilbene derivative, hydrogenated amorphous silicon, hydrogenated amorphous silicon carbide, zinc sulfide, and zinc selenide.

The light emission layer 52 is a region where electron holes and electrons are respectively injected from the first electrodes 13 and the second electrode 14 to the region when voltage is applied by the first electrodes 13 and the second electrode 14 and are joined again. The light emission layer 52 is made of a material with high light emission efficiency. This material includes, for example, a metal oxinoid compound [a 8-hydroxyquinoline metal complex], a naphthalene derivative, an anthracene derivative, a diphenylethylene derivative, a vinyl acetone derivative, a triphenylamine derivative, a butadiene derivative, a coumarin derivative, a benzoxazole derivative, an oxadiazole derivative, an oxazole derivative, a benzimidazole derivative, a thiadiazole derivative, a benzothiazole derivative, a styryl derivative, a styrylamine derivative, a bisstyrylbenzene derivative, a tristyrylbenzene derivative, a perylene derivative, a perinone derivative, an aminopyrene derivative, a pyridine derivative, a rhodamine derivative, an acridine derivative, phenoxazon, a quinacridone derivative, rubrene, poly-p-phenylene vinylene, and polysilane.

The electron transport layer 53 has the function of moving electrons to the light emission layer with favorable efficiency. A material forming the electron transport layer 53 includes, for example, organic compounds such as an oxadiazole derivative, a triazole derivative, a benzoquinone derivative, a naphthoquinone derivative, an anthraquinone derivative, a tetracyanoanthraquinodimethane derivative, a diphenoquinone derivative, a fluorenone derivative, a silole derivative, and a metal oxinoid compound.

The electron injection layer 54 is used for bringing the energy levels of the second electrode 14 and the organic EL layer 17 close to each other to improve the efficiency for injecting electrons from the second electrode 14 to the organic EL layer 17. By this function, the drive voltage of the organic EL element 4 can be lowered. Note that the electron injection layer is also called a cathode buffer layer. A material forming the electron injection layer 54 includes, for example, inorganic alkali compounds such as lithium fluoride (LiF), magnesium fluoride ($MgF_2$), calcium fluoride ($CaF_2$), strontium fluoride ($SrF_2$), and barium fluoride ($BaF_2$), $Al_2O_3$, and SrO.

The second electrode 14 has the function of injecting electrons to the organic EL layer 17. The second electrode 14 is more preferably made of a material with a small work function. This is because formation of the second electrode 14 from the material with a small work function can improve the efficiency for injecting electrons to the organic EL layer 17. Moreover, as illustrated in FIG. 2, the second electrode 14 is formed on the organic EL layer 17.

The material forming the second electrode 14 includes, for example, silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). Moreover, the second electrode 14 may be, for example, made of alloys such as magnesium (Mg)/copper (Cu), magnesium (Mg)/silver (Ag), sodium (Na)/potassium (K), astatine (At)/astatine oxide ($AtO_2$), lithium (Li)/aluminum (Al), lithium (Li)/calcium (Ca)/aluminum (Al), and lithium fluoride (LiF)/calcium (Ca)/aluminum (Al). Further, the second electrode 14 may be, for example, made of conductive oxides such as tin oxide (SnO), zinc oxide (ZnO), indium tin oxide (ITO), and indium zinc oxide (IZO). In addition, the second electrode 14 may be formed from a stack of multiple layers made of the above-described materials.

The material with a small work function includes, for example, magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), and lithium fluoride (LiF)/calcium (Ca)/aluminum (Al).

The edge cover 18 has the function of preventing short circuit of the first electrodes 13 and the second electrode 14. Thus, the edge cover 18 is preferably provided to cover all of peripheral edge portions of the first electrodes 13.

A material forming the edge cover 18 includes, for example, silicon oxide ($SiO_2$), silicon nitride (SiNx (x is a positive number)) including trisilicon tetranitride ($Si_3N_4$) etc., and silicon oxynitride (SiNO).

Moreover, in the present embodiment, the organic EL display panel 30 includes, as illustrated in FIG. 2, a plastic substrate 20 as a sealing substrate facing the plastic substrate 10. The organic EL elements 4 formed on the plastic substrate 10 are provided between the plastic substrate 10 and the plastic substrate 20.

The plastic substrate 20 is a film-shaped substrate exhibiting flexibility and made of a resin material exhibiting insulating properties, and an organic material such as polyimide resin or acrylic resin can be used as the resin material forming the plastic substrate 20.

Moreover, the plastic substrate 20 includes a color filter 45 having multiple colored layers colored in red, green, or blue and a black matrix provided adjacent to each colored layer.

Further, as illustrated in FIG. 2, the organic EL display panel 30 includes a filler 3 having a getter function (the function of adsorbing oxygen and moisture). As illustrated in FIG. 2, the filler 3 is provided on a sealing film 2.

A material forming the filler 3 includes, for example, epoxy resin (thermosetting liquid epoxy resin) and silicon resin. From a perspective of improvement of the moisture adsorption function, the filler 3 contains a dryer such as alkaline earth metal oxides including calcium oxide (CaO), barium oxide (BaO), etc., silica gel, and zeolite.

Further, the organic EL display panel 30 includes a touch panel 25. The touch panel 25 is attached to the plastic substrate 20 through an adhesive layer 24, and is provided between each organic EL element 4 and the inorganic layer 6.

The inorganic layers 6, 7 are for ensuring barrier performance against moisture to prevent deterioration of the organic EL element. A material forming the inorganic layers 6, 7 includes, for example, organic materials such as silicon oxide (SiO$_2$), aluminum oxide (Al$_2$O$_3$), and silicon nitride (SiNx (x is a positive number)) including trisilicon tetranitride (Si$_3$N$_4$) etc.

From a perspective of sufficiently ensuring endurance of the organic EL element 4, the thicknesses of the inorganic layers 6, 7 are preferably 1.5 to 3.5 μm.

Figure 4:
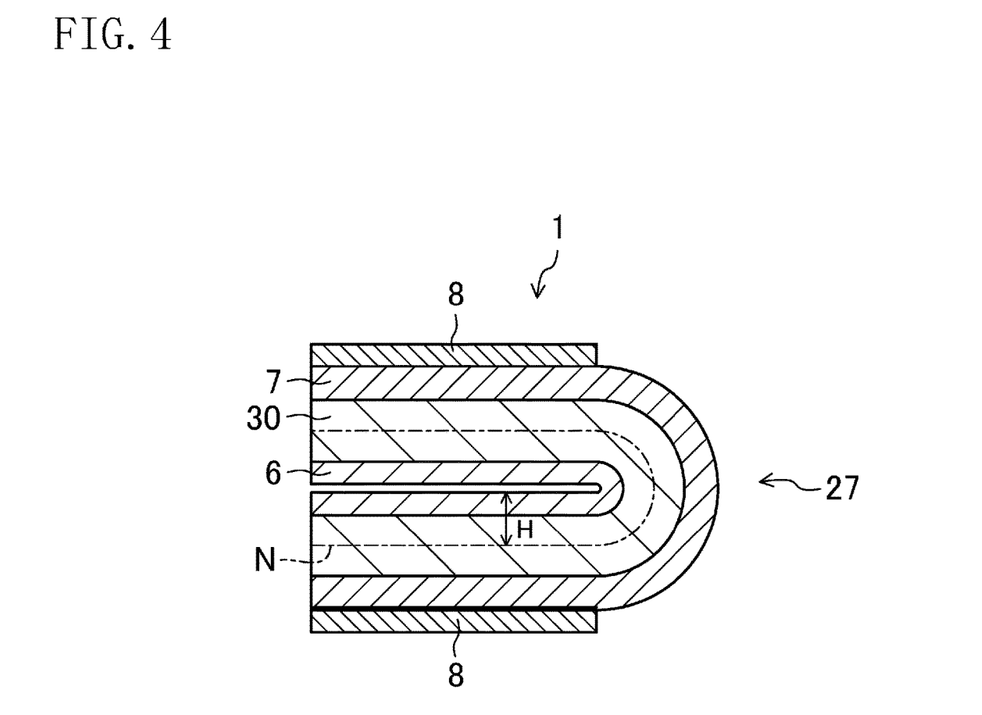
FIG. 4 is a sectional view of a bending state of the organic EL display device according to the first embodiment of the present invention.

The housing 8 is provided to prevent, e.g., direct application of impact to the organic EL display panel 30 to protect the organic EL display panel 30. Note that as illustrated in FIG. 1, a bending portion 27 (a portion not provided with the housing 8) is provided at the organic EL display device 1. As illustrated in FIG. 4, the organic EL display device 1 is bendable due to the bending portion 27.

Note that the organic EL display panel 30 is flexible, and the organic EL display device 1 is configured not to bend at other portions than the bending portion 27 due to the rigid housing 8 exhibiting stiffness.

The present embodiment is characterized in that the entire thickness (i.e., the entire thickness at the bending portion 27) of the organic EL display device 1 is equal to or less than 74 μm.

This is because the thickness T of the organic EL display device 1 is great in a case where the thickness T is greater than 74 μm, and therefore, the inorganic layers 6, 7 might be ruptured due to stress upon bending of the organic EL display device 1. That is, the thickness T of the organic EL display device 1 is set to equal to or less than 74 μm so that rupturing of the inorganic layers 6, 7 can be prevented.

Note that considering the thicknesses of the plastic substrate 10 and the organic EL element 4, the entire thickness T of the organic EL display device 1 of the present embodiment is preferably set to equal to or greater than 30 μm.

From a perspective of further reducing rupturing of the inorganic layers 6, 7, the distortion rate of the inorganic layer 6, 7 is preferably equal to or less than −1 to +1% in a case where the bending radius of the organic EL display device 1 is 3.5 mm.

Note that the "distortion rate" described herein indicates the percentage of the amount of layer extension (contraction) due to bending at the bending portion, and is defined by the bending radius and a distance from a neutral surface. That is, when the bending radius is R and a distance from a neutral surface (a position to which no tensile stress or compressive stress is applied) N formed at the organic EL display device 1 to a layer is H, the distortion rate is represented by H/R. Extension occurs in the case of a positive distortion rate, and contraction occurs in the case of a negative distortion rate. Moreover, when the layer is inside the neutral surface N, the distance H is a negative value.

A tensile testing machine can be used for measurement of the distortion rate leading to rupturing of the inorganic layer. Tensile stress may be applied to the inorganic layer itself or the inorganic layer formed on a ductile material such as a plastic film, and in this manner, the degree of extension as compared to an original length upon rupturing of the inorganic layer may be measured. That is, when the inorganic layer is ruptured upon extension L+ΔL due to tensile stress as compared to the original length L, the distortion rate leading to rupturing is represented by ΔL/L.

Next, one example of the method for manufacturing the organic EL display device of the present embodiment will be described. FIGS. 5 to 8 are sectional views for describing the method for manufacturing the organic EL display device according to the embodiment of the present invention.

Figure 5:
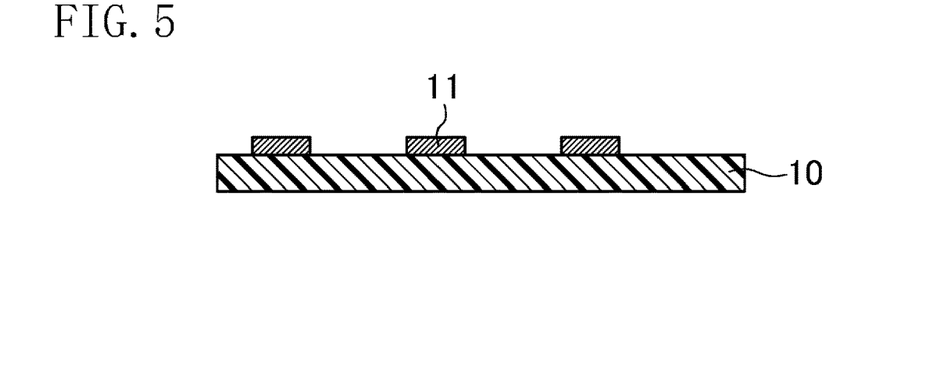
FIG. 5 is a sectional view for describing the method for manufacturing the organic EL display device according to the first embodiment of the present invention.

First, as illustrated in FIG. 5, the multiple TFTs 11 for driving the organic EL elements 4 are formed at predetermined intervals on the plastic substrate 10 having a substrate size of 320×400 mm and a thickness of 0.7 mm.

Figure 6:
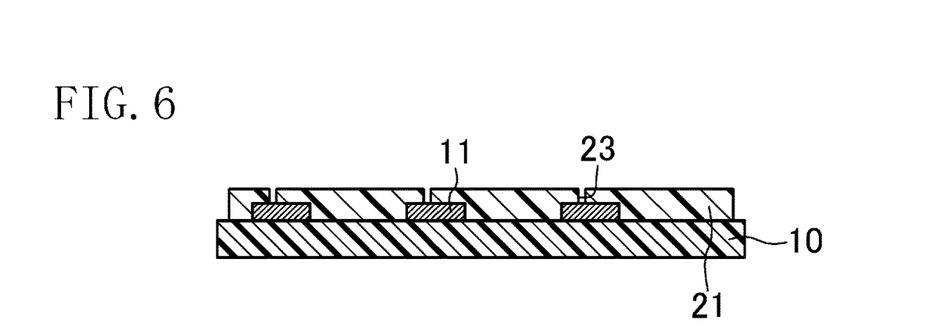
FIG. 6 is a sectional view for describing the method for manufacturing the organic EL display device according to the first embodiment of the present invention.

Subsequently, as illustrated in FIG. 6, light-sensitive acrylic resin is, by a spin coat method, applied onto the plastic substrate 10 provided with the TFTs 11. Using an exposure mask having a predetermined exposure pattern, exposure is performed with a predetermined exposure amount (e.g., 150 mJ/cm$^2$). Then, development is performed using an alkali developing solution. In this manner, the interlayer insulating film 21 having, e.g., a thickness of 2 μm is formed. Note that after development, burning as post baking is performed under predetermined conditions (e.g., 60 minutes at a temperature of 220° C.).

Note that at this point, the contact holes 23 (having, e.g., a diameter of 5 μm) for electrically connecting the first electrodes 13 and the TFTs 11 are formed in the interlayer insulating film 21.

Figure 7:
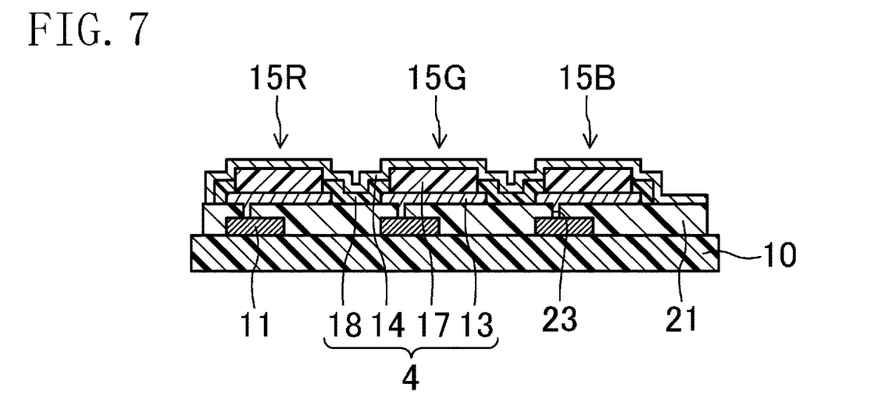
FIG. 7 is a sectional view for describing the method for manufacturing the organic EL display device according to the first embodiment of the present invention.

Subsequently, as illustrated in FIG. 7, an ITO film is formed by a sputtering method, and exposure and development are performed by photolithography. Using an etching method, patterning is performed. In this manner, the multiple first electrodes 13 are formed on the interlayer insulating film 21. At this point, the thickness of the first electrode 13 is, for example, formed to about 100 nm. Note that after development, burning as post baking is performed under predetermined conditions (e.g., 120 minutes at a temperature of 220° C.). Moreover, the first electrodes 13 are each electrically connected to the TFTs 11 through the contact holes 23 formed in the interlayer insulating film 21.

Subsequently, as illustrated in FIG. 7, a silicon oxide film is formed at each peripheral edge portion of the first electrodes 13 by the sputtering method, and exposure and development are performed by photolithography. Using the etching method, patterning is performed. In this manner, the edge cover 18 is formed to cover all of the peripheral edge portions of the first electrodes 13. At this point, the thickness of the edge cover 18 is, for example, formed to about 150 nm.

Next, the organic EL layer 17 including the light emission layer 52 is formed on the first electrodes 13, and thereafter, the second electrode 14 is formed on the organic EL layer 17. Formation of the organic EL layer 17 and the second electrode 14 is performed using a metal mask by a vapor deposition method.

More specifically, the plastic substrate 10 including the first electrodes 13 as illustrated in FIG. 7 is first placed in a chamber of a vapor deposition device. Note that the inside of the chamber of the vapor deposition device is held at a vacuum degree of 1×10$^{-5}$ to 1×10$^{-4}$ (Pa) by a vacuum pump. Moreover, the plastic substrate 10 including the first electrodes 13 is placed in such a state that two sides of the plastic substrate 10 are fixed by a pair of substrate receivers attached to the inside of the chamber.

Then, each vapor deposition material of the electron hole injection layer 50, the electron hole transport layer 51, the light emission layer 52, the electron transport layer 53, and the electron injection layer 54 is sequentially evaporated from a vapor deposition source. Then, the electron hole injection layer 50, the electron hole transport layer 51, the light emission layer 52, the electron transport layer 53, and the electron injection layer 54 are stacked to form the organic EL layer 17 in the pixel region as illustrated in FIG. 7.

Subsequently, as illustrated in FIG. 7, the second electrode 14 is formed on the organic EL layer 17. As a result, each organic EL element 4 including the first electrode 13, the organic EL layer 17, the second electrode 14, and the edge cover 18 is formed on the plastic substrate 10.

Note that a crucible filled with each evaporation material can be used as the evaporation source, for example. The crucible is placed at a lower portion in the chamber, and is equipped with a heater. By this heater, the crucible is heated.

By heating with the heater, the internal temperature of the crucible reaches the evaporation temperatures of various vapor deposition materials, and accordingly, various vapor deposition materials in the crucible are, as evaporated molecules, popped out upward in the chamber.

In a specific example of the method for forming the organic EL layer 17 and the second electrode 14, the electron hole injection layer 50 made of m-MTDATA (4,4,4-tris(3-methylphenylphenylamino)triphenylamine) is first, common to all pixels for RGB, formed through a mask to have, e.g., a thickness of 25 nm on the first electrodes 13 patterned on the plastic substrate 10.

Subsequently, the electron hole transport layer 51 made of α-NPD (4,4-bis(N-1-naphthyl-N-phenylamino)biphenyl) is, common to all pixels for RGB, formed through a mask to have, e.g., a thickness of 30 nm on the electron hole injection layer 50.

Next, a mixture of di(2-naphthyl)anthracene (ADN) and 30% by weight of 2,6-bis((4'-methoxydiphenylamino) styryl-1,5-dicyanonaphthalene (BSN) is, as the light emission layer 52 for the color of red, formed through a mask to have, e.g., a thickness of 30 nm on the electron hole transport layer 51 formed in the pixel region.

Subsequently, a mixture of ADN and 5% by weight of coumarin 6 is, as the light emission layer 52 for the color of green, formed through a mask to have, e.g., a thickness of 30 nm on the electron hole transport layer 51 formed in the pixel region.

Subsequently, a mixture of ADN and 2.5% by weight of 4,4'-bis(2-{4-(N,N-diphenylamino)phenyl}vinyl)biphenyl (DPAVBi) is, as the light emission layer 52 for the color of blue, formed through a mask to have, e.g., a thickness of 30 nm on the electron hole transport layer 51 formed in the pixel region.

Subsequently, 8-hydroxyquinoline aluminum (Alq3) as the electron transport layer 53 is, common to all pixels for RGB, formed through a mask to have, e.g., a thickness of 20 nm on each light emission layer 52.

Subsequently, lithium fluoride (LiF) is, as the electron injection layer 54, formed through a mask to have, e.g., a thickness of 0.3 nm on the electron transport layer 53.

Then, the second electrode 14 made of aluminum (Al) is formed as the second electrode 14 to have, e.g., a thickness of 10 nm by the vapor deposition method.

Figure 8:
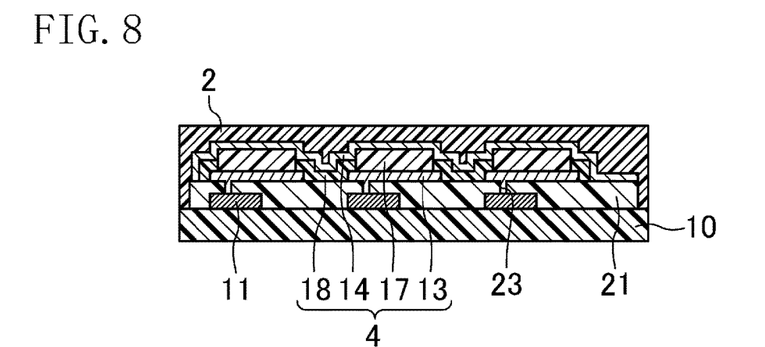
FIG. 8 is a sectional view for describing the method for manufacturing the organic EL display device according to the first embodiment of the present invention.

Subsequently, as illustrated in FIG. 8, the sealing film 2 is formed to cover the organic EL elements 4 on the plastic substrate 10. More specifically, an inorganic material such as silicon oxide ($SiO_2$) or aluminum oxide ($Ak_2O_3$) is stacked on the surfaces of the plastic substrate 10 and the organic EL elements 4 by, e.g., a plasma CVD method, the vapor deposition method, the sputtering method, or an atomic layer deposition method (an ALD method). In this manner, the sealing film 2 is formed.

Next, the color filter 45 is formed on the plastic substrate 20 having a substrate size of 320×400 mm and a thickness of 0.7 mm, for example.

More specifically, e.g., positive-type light-sensitive resin containing dispersed black pigment such as fine carbon particles is applied to the entirety of the plastic substrate 20 by the spin coat method. Thereafter, after the applied light-sensitive resin has been exposed through a photomask, the resin is patterned by development and heating, and the black matrix is formed to have, e.g., a thickness of 2.5 μm on the plastic substrate 20.

Subsequently, e.g., acrylic-based light-sensitive resin colored in red, green, or blue is applied onto the substrate on which the black matrix is formed. After the applied light-sensitive resin has been exposed through a photomask, the resin is patterned by development, and the colored layer (e.g., a red layer R) in the selected color is formed to have, e.g., a thickness of 2.5 μm. For other two colors, similar steps are further repeated to form the colored layers (e.g., a green layer G and a blue layer B) in the other two colors with, e.g., a thickness of 2.5 μm. In this manner, the color filter 45 including the colored layers (the red layer R, the green layer G, and the blue layer B) is formed.

Subsequently, the above-described material forming the filler 3 is applied by, e.g., a dispenser or a mask printing method to cover the color filter 45 formed on the plastic substrate 20. Note that instead of the coating type material, a sheet-shaped material may be used.

Subsequently, in vacuum atmosphere, the plastic substrate 20 is stacked on the plastic substrate 10 provided with the organic EL elements 4 and the sealing film 2 such that the materials forming the organic EL elements 4 and the filler 3 overlap with each other. In this manner, a bonded body of the plastic substrate 10 and the plastic substrate 20 is formed.

Note that when the plastic substrate 10 and the plastic substrate 20 are bonded together, the material of the filler 3 formed on the surface of the plastic substrate 20 is uniformly spread by pressurizing, and the filler 3 is, on the sealing film 2, formed to cover the sealing film 2.

Subsequently, the adhesive layer 24 is provided on the surface of the plastic substrate 20, and the touch panel 25 is provided through the adhesive layer 24. In this manner, the organic EL display panel 30 illustrated in FIG. 2 is manufactured.

Subsequently, the inorganic layer 6 is first formed on the upper surface 30a of the organic EL display panel 30 by the plasma CVD method. Then, the inorganic layer 7 is formed on the lower surface 30b of the organic EL display panel 30. At this point, it may be configured such that end portions of the organic EL display panel 30 are covered with the inorganic layers 6, 7. Note that $SiH_4$, $NH_3$, $H_2$, $N_2$, etc. is used as material gas. At this point, the flow rate of the material gas can be set as necessary.

Then, the housing 8 is provided on the surface of the inorganic layer 7. In this manner, the organic EL display device 1 illustrated in FIG. 1 can be manufactured.

In the present embodiment described above, the following advantageous effects can be obtained.

(1) In the present embodiment, it is, as described in later-described examples, configured such that the inorganic layer 6 is provided on the upper surface 30a of the organic EL display panel 30, the inorganic layer 7 is provided on the lower surface 30b of the organic EL display panel 30, and the entire thickness T of the organic EL display device 1 is set to equal to or less than 74 μm. Thus, even in a case where the organic EL display panel 30 is bent, rupturing of the inorganic layers 6, 7 can be prevented. As a result, deterioration of the organic EL elements 4 can be prevented.

Second Embodiment

Next, a second embodiment of the present invention will be described.

In an organic EL display device, an irregular (curled) shape is determined by a balance in internal stress of each layer. The internal stress depends on the method for forming each layer and the composition of each layer. For example, in a film formed by a sputtering method, sputtered particles have high energy, and therefore, there is disorder in atom arrangement of the formed film. As a result, tendency shows that the internal stress becomes greater.

In the case of a multilayer film including two layers of a layer having internal stress of compression and a layer having internal stress of tension, the layer with the compressive stress is more stable upon extension, and the layer with the tensile stress is more stable upon contraction. Thus, the layer with the compressive stress is extended in a raised shape, and the layer with the tensile stress is contracted in a recessed shape.

The degree of irregularity is determined by, e.g., the strength of the stress of each layer, the thickness of each layer, and the elastic modulus of each layer. In a typical organic EL display device, internal stress is imbalanced. For this reason, there is a problem that distortion occurs at an organic EL display panel and irregularity (curling) is caused at the organic EL display device.

For these reasons, in the present embodiment, the internal stress of the inorganic layer 6 is set to a value different from that of the inorganic layer 7, and a difference in the internal stress between the inorganic layers 6, 7 is provided. In this manner, it is configured to reduce occurrence of distortion in the organic EL display panel 30.

More specifically, as illustrated in FIG. 4, the organic EL display device 1 is, for example, bendable such that the inorganic layer 6 is positioned inward of the inorganic layer 7, and the internal stress of the inorganic layer 6 is set greater than that of the inorganic layer 7 in a non-bending state.

With this configuration, the stress is adjusted across the entirety of the organic EL display device 1, and therefore, occurrence of distortion in the organic EL display panel 30 is reduced. As a result, occurrence of curling in the organic EL display device 1 is reduced.

From a perspective of further reducing occurrence of curling in the organic EL display device 1, the difference between the internal stress of the inorganic layer 6 and the internal stress of the inorganic layer 7 preferably falls within a range of −70 to +70 MPa in the non-bending state (i.e., a flat state).

Note that the "internal stress" described herein indicates stress measured by a thin-film stress measurement device. For example, only warpage of a silicon wafer is measured, and then, warpage is measured again with an inorganic layer being formed on the silicon wafer. In this manner, the internal stress of the inorganic layer can be measured based on a difference between measurement values.

Moreover, the present embodiment employs the following configuration: the compositions and film formation conditions of the inorganic layers 6, 7 are obtained in advance such that the internal stresses of the inorganic layers 6, 7 measured by the above-described measurement method and the difference between the internal stress of the inorganic layer 6 and the internal stress of the inorganic layer 7 fall within the above-described ranges; and film formation is performed under these conditions.

For example, when the inorganic layers 6, 7 are formed by a plasma CVD method, the flow rates of $SiH_4$, $NH_3$, $H_2$, $N_2$, etc. as the material gas are controlled so that the internal stresses of the inorganic layers 6, 7 and the difference between the internal stress of the inorganic layer 6 and the internal stress of the inorganic layer 7 can be controlled.

In the present embodiment described above, the following advantageous effects (2) to (4) can be obtained in addition to the above-described advantageous effect (1).

(2) In the present embodiment, it is configured such that the difference in the internal stress between the inorganic layers 6, 7 is provided and the internal stress of the inorganic layer 6 is set greater than that of the inorganic layer 7 in the non-bending state. Thus, occurrence of distortion at the organic EL display panel 30 is reduced, and therefore, occurrence of curling at the organic EL display device 1 can be reduced.

(3) Moreover, it is configured such that in the non-bending state, the difference between the internal stress of the inorganic layer 6 and the internal stress of the inorganic layer 7 is set to −70 to +70 MPa. Thus, occurrence of curling at the organic EL display device 1 can be further reduced.

(4) Further, it is configured such that the inorganic layer 6 and the inorganic layer 7 are formed by the plasma CVD method. Thus, the internal stresses of the inorganic layers 6, 7 can be controlled by a simple method.

Third Embodiment

Figure 9:
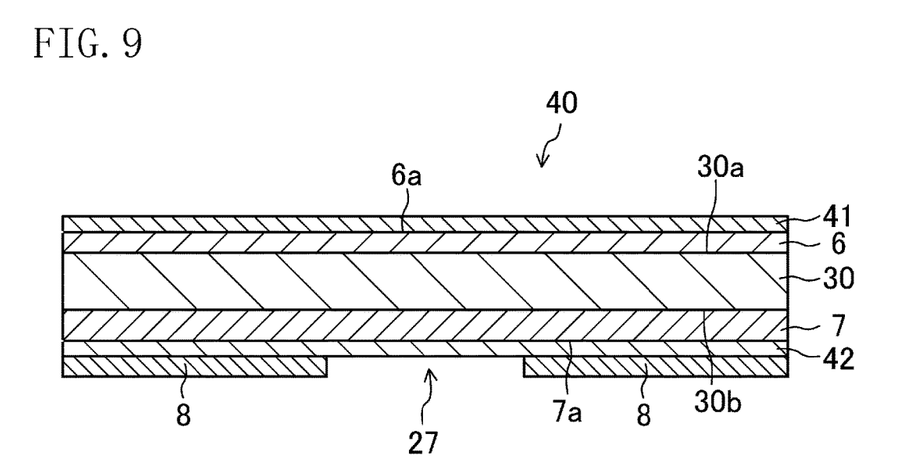
FIG. 9 is a sectional view of an organic EL display device according to a third embodiment of the present invention.

Next, a third embodiment of the present invention will be described. FIG. 9 is a sectional view of an organic EL display device according to a third embodiment of the present invention. Note that the same reference numerals as those of the above-described first embodiment are used to represent equivalent elements, and description thereof will not be repeated.

As illustrated in FIG. 9, an organic EL display device 40 of the present embodiment is characterized in that inorganic layers 41, 42 are provided on surfaces 6a, 7a of inorganic layers 6, 7 opposite to an organic EL display panel 30.

In a typical organic EL display device, when a bending state of the organic EL display device is held, there are problems that a bending mark is caused due to plastic deformation and remains even after the bending state has been cancelled.

For these reasons, in the present embodiment, it is configured such that the inorganic layers 41, 42 made of, e.g., silicon carbonitride (SiCN) are provided at the outermost layer of the organic EL display device 40 to reduce the bending mark.

That is, the bending mark is caused due to plastic deformation of an organic layer, but no plastic deformation occurs at the inorganic layer. Thus, the inorganic layers are provided on the outside of the organic EL display panel 30 so that plastic deformation of the organic EL display panel due to stress upon bending can be reduced. As a result, the bending mark is reduced.

From a perspective of further reducing the bending mark, the distortion rate of the inorganic layer 41, 42 in a case where the bending radius of the organic EL display device 40 is 3.5 mm preferably falls within −1 to +1%.

Moreover, in the organic EL display device 40 in the present embodiment, the inorganic layers 41, 42 are formed on the surfaces 6a, 7a of the inorganic layers 6, 7 by a method similar to that of the inorganic layers 6, 7 after the inorganic layer 6 has been formed on an upper surface 30a of the organic EL display panel 30 and the inorganic layer 7 has been formed on a lower surface 30b of the organic EL display panel 30 as in the above-described first embodiment.

Then, a housing 8 is provided on a surface of the inorganic layer 42. In this manner, the organic EL display device 40 illustrated in FIG. 9 can be manufactured.

In the present embodiment described above, the following advantageous effects (5) to (6) can be obtained in addition to the above-described advantageous effects (1) to (4).

(5) In the present embodiment, it is configured such that the inorganic layers 41, 42 are provided on the surfaces 6a, 7a of the inorganic layers 6, 7 opposite to the organic EL display panel 30. Thus, the bending mark of the organic EL display device 40 can be reduced.

(6) The distortion rate of the inorganic layer 41, 42 in a case where the bending radius of the organic EL display device 40 is 3.5 mm is set to −1% to +1%, and therefore, the bending mark of the organic EL display device 40 can be further reduced.

Note that the above-described embodiments may be changed as follows.

Figure 10:
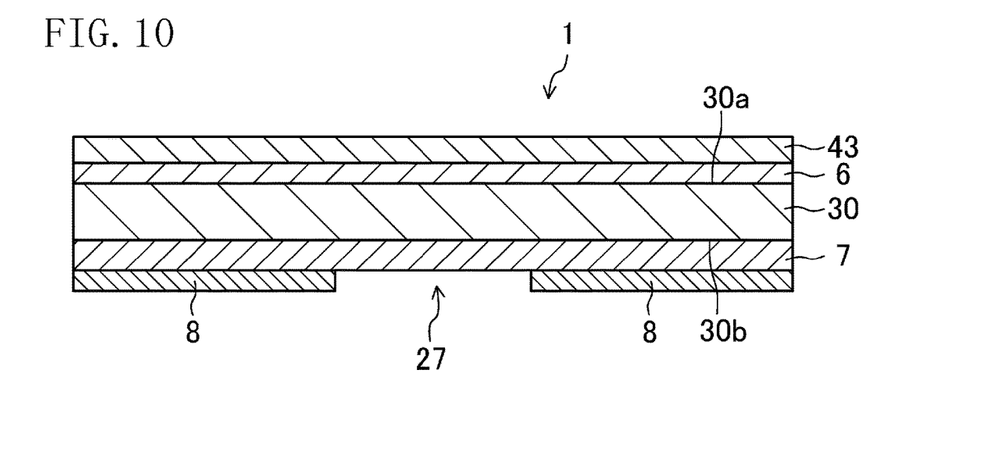
FIG. 10 is a sectional view of an organic EL display device according to a variation of the present invention.

As illustrated in FIG. 10, it may be configured such that a hard coating layer 43 is provided on the surface of the inorganic layer 6 in the organic EL display device 1 illustrated in FIG. 1. With such a configuration, the surface of the organic EL display device 1 can be protected, and abrasion resistance and pressing resistance (including resistance in a pencil hardness test) can be improved.

Figure 11:
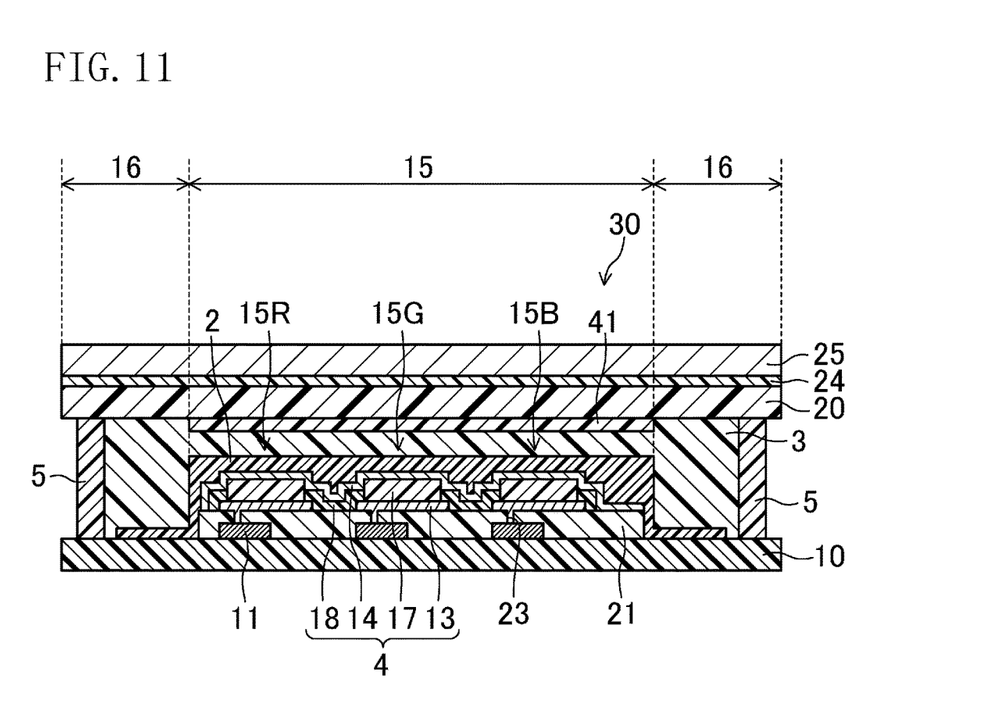
FIG. 11 is a sectional view of an organic EL display panel in the organic EL display device according to the variation of the present invention.

Moreover, as illustrated in FIG. 11, it may be configured such that a seal material 5 provided between the plastic substrate 10 and the plastic substrate 20 in the organic EL display panel 30 illustrated in FIG. 2 and bonding the plastic substrate 10 and the plastic substrate 20 to seal the organic EL elements 4 is provided.

With this seal material 5, moisture and oxygen penetrating the sealing film 2 from the outside can be blocked, and therefore, deterioration of the organic EL elements 4 can be reliably prevented.

Note that as illustrated in FIG. 11, it is configured such that a frame region (a seal material formation region) 16 where the seal material 5 is arranged is defined at the periphery of the display region 15 and the seal material 5 is provided in a frame shape to seal the organic EL elements 4 in the frame region 16 and bond the plastic substrate 10 and the plastic substrate 20.

Further, the above-described embodiments have such a structure that the organic EL layer 17 has the stack of five layers including the electron hole injection layer 50, the electron hole transport layer 51, the light emission layer 52, the electron transport layer 53, and the electron injection layer 54, but the organic EL layer 17 is not limited to the five-layer multilayer structure. For example, the organic EL layer 17 may have a three-layer multilayer structure of an electron-hole-injection-plus-electron-hole-transport layer, a light emission layer, and an electron-transport-plus-electron-injection layer.

Moreover, the multilayer structure may be inverted such that the first electrodes 13 serve as cathodes and the second electrode 14 serves as an anode. In this case, the multilayer structure includes, from below, the first electrodes 13 as the cathodes, the electron injection layer 54, the electron transport layer 53, the light emission layer 52, the electron hole transport layer 51, the electron hole injection layer 50, and the second electrode 14 as the anode. Moreover, in this case, the materials used for the first electrode 13 and the second electrode 14 are interchanged.

EXAMPLES

Hereinafter, the present invention will be described with reference to examples.

Note that the present invention is not limited to these examples. Variations and changes can be made to these examples based on the gist of the present invention, and it is not intended to exclude these variations and changes from the scope of the present invention.

First Example (Production of Organic EL Display Panel)

First, an organic EL display panel (a thickness: 60.2 μm) having the following configuration was produced by the above-described method.

Plastic substrate: polyimide film with thickness of 12 μm

TFT: typical bottom-gate TFT including wiring layer formed from multilayer film of Ti/Al/Ti or Alai and having total thickness of 5 μm Interlayer insulating film: light-sensitive acrylic resin with thickness of 0.5 μm Organic EL element: typical organic EL element with total thickness of 0.2 μm Sealing film: silicon nitride film formed by plasma CVD method and having thickness of 3.5 μm Filler: epoxy resin with thickness of 6 μm Color filter: typical color filter including colored layers (red layer R, green layer G, and blue layer B) and having thickness of 5.0 μm Plastic substrate: polyimide film with thickness of 12 μm Adhesive layer: epoxy resin with thickness of 1 μm Touch panel: aramid film with thickness of 15 μm (Formation of Inorganic Layer)

Next, an inorganic layer (a thickness: 3.5 μm) made of silicon nitride was formed on an upper surface of the produced organic EL display panel by the plasma CVD method, and an inorganic layer (a thickness: 3.5 μm) made of silicon nitride was formed on a lower surface of the organic EL display panel. An organic EL display device having a total thickness of 67.2 μm was produced.

Note that the flow rate of hydrogen gas ($H_2$) was set to 2500 sccm, the flow rate of nitrogen gas ($N_2$) was set to 4000 sccm, the flow rate of ammonia ($NH_3$) was set to 500 sccm, and the flow rate of silane ($SiH_4$) was set to 300 sccm. Moreover, power upon plasma processing was set to 1000 W.

(Measurement of Distortion Rate of Inorganic Layer)

Next, the distortion rate of the inorganic layer in the produced organic EL display device was calculated. More specifically, when the distance H from the neutral surface in a state in which the organic EL display device is bent such that the bending radius R is 3.5 mm is measured, the distance H at the inorganic layer formed on the upper surface of the organic EL display panel was −34.7 μm, and the distance H at the inorganic layer formed on the lower surface of the organic EL display panel was 31.9 μm. Since the distortion rate is represented as H/R, the distortion rate of the inorganic layer formed on the upper surface of the organic EL display panel was −0.99%, and the distortion rate of the inorganic layer formed on the lower surface of the organic EL display panel was 0.91%.

(Measurement of Internal Stress of Inorganic Layer)

Next, the internal stress in each inorganic layer was measured. More specifically, only warpage of a silicon wafer was measured using a thin-film stress measurement device (a product name: FLX-1320S manufactured by Toho Technology Corporation). Next, after the inorganic layer had been formed to have a thickness of 500 nm on the silicon wafer by the plasma CVD method, warpage of the silicon wafer was measured again. Then, the internal stress of the inorganic layer was calculated using software of the above-described device from a warpage difference. As a result, the internal stress of each inorganic layer (i.e., the inorganic layer formed on the upper surface of the organic EL display panel and the inorganic layer formed on the lower surface of the organic EL display panel) was −56 [MPa].

(Evaluation of Rupturing of Inorganic Layer)

Next, the produced organic EL display device was bent such that the bending radius is 3.5 mm, and the presence or absence of rupturing at each inorganic layer was evaluated. More specifically, using a desktop type endurance test DLD (a product name: MLH-FS manufactured by Yuasa System Co., Ltd.), a tension-free U-shape folding test (a bending radius: 3.5 mm) was performed for the produced organic EL display device. Then, after bending has been performed one hundred thousand times, it was, by an optical microscope, checked whether or not rupturing occurs at the inorganic layer of the organic EL display device. The above-described results are shown in Table 1.

(Evaluation of Curling Properties)

Next, curling properties of the produced organic EL display device were evaluated. More specifically, the organic EL display device was placed on a horizontal table, and was fixed at one point of an end portion. Next, the distance of separation of the other end portion from the horizontal table was measured. Then, when the measured distance is less than 5 mm, it was determined that no curling occurs. The above-described results are shown in Table 1. Note that in the organic EL display device, a distance from the fixed end portion to the other end portion was 100 mm.

(Evaluation of Bending Mark)

Next, a bending mark of the produced organic EL display device was evaluated. More specifically, the produced organic EL display device was bent such that the bending radius is 3.5 mm, and such a bending state was held for 300 hours. Thereafter, the bending state was cancelled, and an actual residual angle (an actual bending mark angle) of a bending portion was measured. Then, in a case where the bending mark angle is equal to or less than 5.4° after the bending state has been held for 300 hours, it was determined that the bending mark is small. The above-described results are shown in Table 1.

Second Example (Production of Organic EL Display Panel)

First, an organic EL display panel (a thickness: 44.2 μm) having the following configuration was produced by a method similar to those of the first example.

Plastic substrate: polyimide film with thickness of 12 μm

TFT: typical bottom-gate TFT including wiring layer formed from multilayer film of Ti/Al/Ti or Al/Ti and having total thickness of 5 μm Interlayer insulating film: light-sensitive acrylic resin with thickness of 0.5 μm Organic EL element: typical organic EL element with total thickness of 0.2 μm Sealing film: silicon nitride film formed by plasma CVD method and having thickness of 3.5 μm Filler: epoxy resin with thickness of 6 μm Color filter: touch sensor-equipped color filter including colored layers (red layer R, green layer G, and blue layer B) and having thickness of 5.0 μm Plastic substrate: polyimide film with thickness of 12 μm Next, as in the first example, inorganic layers were formed on upper and lower sides of the organic EL display panel produced as described above, and in this manner, an organic EL display device with a total thickness of 51.2 μm was produced. Moreover, measurement of the distortion rate of the inorganic layer, measurement of the internal stress of the inorganic layer, evaluation of rupturing of the inorganic layer, evaluation of curling properties, and evaluation of a bending mark were performed. The above-described results are shown in Table 1.

Third Example (Formation of Inorganic Layer)

As in the above-described first example, after an organic EL display panel with a thickness of 60.2 μm has been produced, an inorganic layer (a thickness: 3.5 μm) made of silicon nitride was formed on an upper surface of the organic EL display panel by a plasma CVD method, and an inorganic layer (a thickness: 3.5 μm) made of silicon nitride was formed on a lower surface of the organic EL display panel. An organic EL display device having a total thickness of 67.2 μm was produced.

Note that as the conditions for film formation of the inorganic layer made of silicon nitride on the upper surface, the flow rate of hydrogen gas ($H_2$) was set to 2500 sccm, the flow rate of nitrogen gas ($N_2$) was set to 4000 sccm, the flow rate of ammonia ($NH_3$) was set to 700 sccm, and the flow rate of silane ($SiH_4$) was set to 300 sccm. Moreover, power upon plasma processing was set to 1000 W.

Note that as the conditions for film formation of the inorganic layer made of silicon nitride on the lower surface, the flow rate of hydrogen gas ($H_2$) was set to 2500 sccm, the flow rate of nitrogen gas ($N_2$) was set to 4000 sccm, the flow rate of ammonia ($NH_3$) was set to 500 sccm, and the flow rate of silane ($SiH_4$) was set to 300 sccm. Moreover, power upon plasma processing was set to 1000 W.

(Measurement of Internal Stress of Inorganic Layer)

Next, as in the first example, when the internal stress in each inorganic layer (i.e., the inorganic layer formed on the upper surface of the organic EL display panel and the inorganic layer formed on the lower surface of the organic EL display panel) is measured, the internal stress of the inorganic layer on the panel upper side was 0 [MPa], and the internal stress of the inorganic layer on the panel lower side was −56 [MPa].

Next, as in the first example, measurement of the distortion rate of the inorganic layer, evaluation of rupturing of the inorganic layer, evaluation of curling properties, and evaluation of a bending mark were performed. The above-described results are shown in Table 1.

Fourth Example

First, as in the above-described first embodiment, after an organic EL display panel having a total thickness of 67.2 μm had been produced, inorganic layers (a thickness: 3.0 μm) made of silicon carbonitride (SiCN) were, by a plasma CVD method, formed on surfaces of a panel-upper-side inorganic layer and a panel-lower-side inorganic layer opposite to an organic EL display panel side. In this manner, an organic EL display device having a total thickness of 73.2 μm was produced. Note that for formation from silicon carbonitride by the plasma CVD method, a mixture of monosilane, ammonia, nitrogen, hydrogen, nitrous oxide ($N_2O$), and acetylene is used as supply gas, as necessary.

(Measurement of Distortion Rate of Inorganic Layer (Silicon Carbonitride Layer)

Next, the distortion rate of the inorganic layer (the silicon carbonitride layer) in the produced organic EL display device was calculated. More specifically, when a distance H from a neutral surface in a state in which the organic EL display device is bent such that the bending radius R is 3.5 mm is measured, the distance H at the inorganic layer (the silicon carbonitride layer) formed on the upper surface of the organic EL display panel was −38.2 μm, and the distance H at the inorganic layer (the silicon carbonitride layer) formed on the lower surface of the organic EL display panel was 35.4 μm. Since the distortion rate is represented as H/R, the distortion rate of the inorganic layer (silicon carbonitride) on the upper side of the panel was −1.09%, and the distortion rate of the inorganic layer (silicon carbonitride) formed on the lower side of the panel was 1.01%.

Next, as in the first example, measurement of the distortion rate of the inorganic layer, measurement of the internal stress of the inorganic layer, evaluation of rupturing of the inorganic layer, evaluation of curling properties, and evaluation of a bending mark were performed. The above-described results are shown in Table 1.

First Comparative Example (Production of Organic EL Display Panel)
First, an organic EL display panel (a thickness: 73 μm) having the following configuration was produced by the above-described method.
Plastic substrate: polyimide film with thickness of 12 μm
TFT: typical bottom-gate TFT including wiring layer formed from multilayer film of Ti/Al/Ti or Al/Ti and having total thickness of 5 μm
Interlayer insulating film: light-sensitive acrylic resin with thickness of 0.5 μm
Organic EL element: typical organic EL element with total thickness of 0.2 μm
Sealing film: silicon nitride film formed by plasma CVD method and having thickness of 3.5 μm
Filler: epoxy resin with thickness of 10 μm
Color filter: typical color filter including colored layers (red layer R, green layer G, and blue layer B) and having thickness of 5.0 μm
Plastic substrate: polyimide film with thickness of 12 μm
Adhesive layer: epoxy resin with thickness of 5 μm
Touch panel: aramid film with thickness of 20 μm
Next, as in the first example, inorganic layers were formed, and an organic EL display device with a total thickness of 80 μm was produced. In addition, measurement of the distortion rate of the inorganic layer, measurement of the internal stress of the inorganic layer, evaluation of rupturing of the inorganic layer, evaluation of curling properties, and evaluation of a bending mark were performed. The above-described results are shown in As shown in Table 1, in the first to fourth examples, the thickness of the entirety of the organic EL display device is equal to or less than 74 μm, and therefore, the distortion rate of the inorganic layer falls within a range of −1 to +1%. This shows that rupturing of the inorganic layer upon bending of the organic EL display device can be prevented.

Particularly in the third example, the difference in the internal stress of the inorganic layer (a difference of 56 MPa) is provided, and therefore, it is shown that occurrence of curling at the organic EL display device can be further reduced.

Moreover, in the fourth example, it is configured such that the inorganic layers are provided at the outermost layers, and it is shown that the bending mark of the organic EL display device can be further reduced.

In the first comparative example where the total thickness of the organic EL display device is greater than 74 μm, the distortion rate of the inorganic layer falls outside a range of −1 to +1%, and it is shown that rupturing of the inorganic layer occurs.

INDUSTRIAL APPLICABILITY

As described above, the present invention is useful for an organic EL display device including an organic EL elements.

DESCRIPTION OF REFERENCE CHARACTERS

1 Organic EL Display Device
4 Organic EL Element
6 Inorganic Layer (First Inorganic Layer)
7 Inorganic Layer (Second Inorganic Layer)
8 Housing
10 Plastic Substrate
17 Organic EL Layer
20 Plastic Substrate
27 Bending Portion
30 Organic EL Display Panel
41 Inorganic Layer (Third Inorganic Layer)
42 Inorganic Layer (Fourth Inorganic Layer)
T Thickness Of Organic EL Display Device

The invention claimed is:
1. An organic EL display device comprising:
an organic EL display panel including a plastic substrate exhibiting flexibility and an organic EL element formed on the plastic substrate;

TABLE 1

| | Thickness of Organic EL Display Device [μm] | Internal Stress of Inorganic Layer [MPa] | | Internal Stress Difference between Inorganic Layers [MPa] | Distortion Rate of Inorganic Layer [%] | | Distortion Rate of Inorganic Layer (Silicon Carbonitride Layer)[%] | | Present or Absence of Rupturing of Inorganic Layer | Curling Properties Distance from Horizontal Table[mm] | Bending Mark Angle [°] |
|---|---|---|---|---|---|---|---|---|---|---|---|
| | | Panel Upper Side | Panel Lower Side | | Panel Upper Side | Panel Lower Side | Panel Upper Side | Panel Lower Side | | | |
| First Example | 67.2 | −56 | −56 | 0 | −0.99 | 0.91 | — | — | Absent | 3 | 5.1 |
| Second Example | 51.2 | −56 | −56 | 0 | −0.99 | 0.91 | — | — | Absent | 3 | 5.1 |
| Third Example | 67.2 | 0 | −56 | 56 | −0.99 | 0.91 | — | — | Absent | 4 | 5.1 |
| Fourth Example | 73.2 | −56 | −56 | 0 | −0.99 | 0.91 | −1.09 | 1.01 | Absent | 2 | 4.3 |
| First Comparative Example | 80 | −56 | −56 | 0 | −1.27 | 1.21 | — | — | Present | 1 | 5.1 | a first inorganic layer provided on an upper surface of the organic EL display panel; and a second inorganic layer provided on a lower surface of the organic EL display panel as a surface of the plastic substrate opposite to a first inorganic layer side, wherein an entire thickness of the organic EL display device is equal to or less than 74 µm; and distortion rates of the first inorganic layer and the second inorganic layer in a case where a bending radius of the organic EL display device is 3.5 mm are −1 to +1%.

2. The organic EL display device according to claim 1, wherein an internal stress of the first inorganic layer and an internal stress of the second inorganic layer are different from each other.

3. The organic EL display device according to claim 2, wherein the organic EL display device is bendable such that the first inorganic layer is positioned inward of the second inorganic layer, and in a non-bending state, the internal stress of the first inorganic layer is greater than that of the second inorganic layer.

4. The organic EL display device according to claim 2, wherein in the non-bending state, a difference between the internal stress of the first inorganic layer and the internal stress of the second inorganic layer is −70 to +70 MPa.

5. The organic EL display device according to claim 1, wherein the first inorganic layer and the second inorganic layer are made of one selected from a group consisting of silicon oxide, silicon nitride, and aluminum oxide.

6. The organic EL display device according to claim 1, wherein a third inorganic layer is provided on a surface of the first inorganic layer opposite to an organic EL display panel side, and a fourth inorganic layer is provided on a surface of the second inorganic layer opposite to the organic EL display panel side.

7. The organic EL display device according to claim 6, wherein distortion rates of the third inorganic layer and the fourth inorganic layer in a case where the bending radius of the organic EL display device is 3.5 mm are −1 to +1%.

8. The organic EL display device according to claim 6, wherein the third and fourth inorganic layers are made of silicon carbonitride.

9. The organic EL display device according claim 1, further comprising:

a housing provided on a surface of the second inorganic layer, wherein the housing is not provided at a bending portion of the organic EL display device.

10. An organic EL display device comprising:

an organic EL display panel including a plastic substrate exhibiting flexibility and an organic EL element formed on the plastic substrate;

a first inorganic layer provided on an upper surface of the organic EL display panel; and a second inorganic layer provided on a lower surface of the organic EL display panel as a surface of the plastic substrate opposite to a first inorganic layer side, wherein an entire thickness of the organic EL display device is equal to or less than 74 µm; and an internal stress of the first inorganic layer and an internal stress of the second inorganic layer are different from each other.

11. The organic EL display device according to claim 10, wherein the organic EL display device is bendable such that the first inorganic layer is positioned inward of the second inorganic layer, and in a non-bending state, the internal stress of the first inorganic layer is greater than that of the second inorganic layer.

12. The organic EL display device according to claim 10, wherein in the non-bending state, a difference between the internal stress of the first inorganic layer and the internal stress of the second inorganic layer is −70 to +70 MPa.

13. The organic EL display device according to claim 10, wherein the first inorganic layer and the second inorganic layer are made of one selected from a group consisting of silicon oxide, silicon nitride, and aluminum oxide.

14. The organic EL display device according to claim 10, wherein a third inorganic layer is provided on a surface of the first inorganic layer opposite to an organic EL display panel side, and a fourth inorganic layer is provided on a surface of the second inorganic layer opposite to the organic EL display panel side.

15. The organic EL display device according to claim 14, wherein distortion rates of the third inorganic layer and the fourth inorganic layer in a case where the bending radius of the organic EL display device is 3.5 mm are −1 to +1%.

16. The organic EL display device according to claim 14, wherein the third and fourth inorganic layers are made of silicon carbonitride.

17. The organic EL display device according claim 10, further comprising:

a housing provided on a surface of the second inorganic layer, wherein the housing is not provided at a bending portion of the organic EL display device.

18. An organic EL display device comprising:

an organic EL display panel including a plastic substrate exhibiting flexibility and an organic EL element formed on the plastic substrate;

a first inorganic layer provided on an upper surface of the organic EL display panel; and a second inorganic layer provided on a lower surface of the organic EL display panel as a surface of the plastic substrate opposite to a first inorganic layer side, wherein an entire thickness of the organic EL display device is equal to or less than 74 µm;

a third inorganic layer is provided on a surface of the first inorganic layer opposite to an organic EL display panel side, and a fourth inorganic layer is provided on a surface of the second inorganic layer opposite to the organic EL display panel side; and the third and fourth inorganic layers are made of silicon carbonitride.

19. The organic EL display device according to claim 18, wherein the first inorganic layer and the second inorganic layer are made of one selected from a group consisting of silicon oxide, silicon nitride, and aluminum oxide.

20. The organic EL display device according to claim 18, wherein
distortion rates of the third inorganic layer and the fourth inorganic layer in a case where the bending radius of the organic EL display device is 3.5 mm are −1 to +1%.

* * * * *